United States Patent
Su et al.

(10) Patent No.: US 11,460,969 B2
(45) Date of Patent: Oct. 4, 2022

(54) MUTUALLY CAPACITIVE SENSOR FOR A TOUCHPAD

(71) Applicant: NXP USA, Inc., Austin, TX (US)

(72) Inventors: Yong Su, Suzhou (CN); Yonggang Chen, Suzhou (CN); Wenwei Jiang, Beijing (CN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/444,331

(22) Filed: Aug. 3, 2021

(65) Prior Publication Data

US 2022/0100323 A1    Mar. 31, 2022

(30) Foreign Application Priority Data

Sep. 28, 2020 (CN) .......................... 202011044433.9

(51) Int. Cl.
*G06F 3/044* (2006.01)
*G06F 3/041* (2006.01)

(52) U.S. Cl.
CPC .......... *G06F 3/0448* (2019.05); *G06F 3/0416* (2013.01); *G06F 3/0443* (2019.05)

(58) Field of Classification Search
CPC .... G06F 3/0448; G06F 3/0416; G06F 3/0443; H03K 2017/9613; H03K 2217/960775; H03K 2217/960785; H03K 17/9622; H03K 17/962
See application file for complete search history.

(56) References Cited

U.S. PATENT DOCUMENTS

| | | | |
|---|---|---|---|
| 8,514,185 B2 | 8/2013 | Hotelling | |
| 2007/0008299 A1* | 1/2007 | Hristov | G06F 3/0443 345/173 |
| 2007/0229472 A1 | 10/2007 | Bytheway | |
| 2008/0006453 A1 | 1/2008 | Hotelling | |
| 2010/0220075 A1* | 9/2010 | Kuo | G06F 3/0446 324/661 |
| 2014/0049505 A1* | 2/2014 | Radivojevic | G08B 6/00 345/173 |
| 2014/0160368 A1* | 6/2014 | Huang | G06F 3/0446 349/12 |
| 2014/0192027 A1* | 7/2014 | Ksondzyk | G06F 3/0448 345/178 |
| 2014/0210784 A1* | 7/2014 | Gourevitch | G06F 3/0443 345/174 |
| 2014/0332361 A1* | 11/2014 | Huang | H03K 17/962 200/600 |
| 2018/0046290 A1* | 2/2018 | Song | G06F 3/0412 |

(Continued)

FOREIGN PATENT DOCUMENTS

CN    201854262 U    6/2011
CN    103399677 A    11/2013

(Continued)

*Primary Examiner* — Rodney Amadiz

(57) ABSTRACT

A mutually capacitive touch sensor includes a first capacitor electrode and a second capacitor electrode. The second capacitor electrode is adjacent and spatially separated from the first capacitor electrode. An inner region is disposed between the first capacitor electrode and the second capacitor electrode, wherein the first capacitor electrode and the second capacitor electrode are arranged to surround the inner region. The inner region may include a hole for a backlight.

20 Claims, 4 Drawing Sheets

(56) References Cited

U.S. PATENT DOCUMENTS

| | | |
|---|---|---|
| 2018/0062649 A1 | 3/2018 | Salter et al. |
| 2018/0224964 A1 | 8/2018 | Church et al. |
| 2021/0181898 A1* | 6/2021 | Chen .................... G06F 3/0412 |

FOREIGN PATENT DOCUMENTS

| | | | |
|---|---|---|---|
| EP | 1892737 A1 * | 2/2008 | ............. G06F 3/045 |
| JP | 4788523 B2 | 10/2011 | |
| KR | 101923154 B1 | 11/2018 | |
| TW | 201133065 A1 | 10/2011 | |
| WO | PCT-2017/199035 A1 | 11/2017 | |
| WO | PCT-W02019053800 A1 | 1/2020 | |

* cited by examiner

MUTUALLY CAPACITIVE SENSOR FOR A TOUCHPAD

CROSS-REFERENCE TO RELATED APPLICATIONS

This application claims the priority under 35 U.S.C. § 119 of China application no. 202011044433.9, filed on 28 Sep. 2020, the contents of which are incorporated by reference herein.

BACKGROUND

The present specification relates to mutually capacitive sensors for use in a touchpad, and touch-sensitive devices comprising mutually capacitive sensors.

Mutual capacitance is a popular capacitive touch sensing method that is different to self-capacitive touch sensing.

A mutually capacitive touch sensor comprises two electrodes, wherein each electrode requires a pin from the microcontroller (MCU). A 'touch' on the sensor is detected by the resulting change in capacitance between the two electrodes. A mutual capacitive touch sensor can be used to create a touchpad with fewer MCU pins than would be required for a self-capacitive sensor. Thus, mutual capacitive touch sensors are commonly used for keypad matrices and other touchpads that require a low cost MCU solution with fewer pins and a small printed circuit board (PCB) area.

However, to make the mutual capacitive touch sensor work correctly, the sensor should be designed carefully under special limitations. It is important to maximise the capacitive sensitivity in order reliably and accurately detect a 'touch' on the sensor.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a mutually capacitive touch sensor comprising a first capacitor electrode, a second capacitor electrode, wherein the second capacitor electrode is adjacent and spatially separated from the first capacitor electrode, and an inner region is disposed between the first capacitor electrode and the second capacitor electrode, wherein the first capacitor electrode and the second capacitor electrode are arranged to surround the inner region.

The present disclosure may provide an improved touch sensor, whereby the arrangement of the first capacitor electrode and the second capacitor electrode may result in a high capacitive sensitivity.

The inner region provides a space or gap surrounded by the first capacitor electrode and the second capacitor electrode. This may allow a hole for a backlight to be inserted in the inner region without reducing capacitive sensitivity or affecting the operation of the touch sensor. It will be appreciated that a backlight is not always desired, so the touch sensor could be supplied without pre-inserting the hole into the inner region.

The inner region may be a central region. Thus, the inner region may be disposed at the centre of the touch sensor.

The first capacitor electrode may be the transmit or drive electrode (X) and the second capacitor electrode may be the receive or sense electrode (Y).

The touch sensor may be provided on a printed circuit board (PCB). The inner region or central region may comprise a gap or space on the printed circuit board.

Optionally, the first capacitor electrode and the second capacitor electrode each form a centrosymmetric pattern around the inner region. This arrangement or design may be beneficial if the touch sensor is used as a touch button.

The first capacitor electrode and the second capacitor electrode may be arranged in a concentric pattern around the inner region.

The first capacitor electrode and the second capacitor electrode may be interdigitated. Optionally, the first capacitor electrode and the second capacitor electrode may be arranged in an interdigitated square pattern, or an interdigitated concentric pattern.

The first capacitor electrode and the second capacitor electrode may each comprise a plurality of connected rings or incomplete rings surrounding the inner region. Each ring or incomplete ring of the second capacitor electrode may be disposed between adjacent rings or incomplete rings of the first capacitor electrode.

Optionally, the first capacitor electrode comprises a first terminal and the second capacitor electrode comprises a second terminal. The first and second terminals may be disposed at opposing edges or corners of the touch sensor.

Optionally, the first capacitor electrode does not overlap the second capacitor electrode.

The first capacitor electrode may have a large surface area relative to the second capacitor electrode. The first capacitor electrode may be wider than the second capacitor electrode.

Optionally, the width of the first capacitor electrode is between 3 to 10 times the width of the second capacitor electrode. In some embodiments, the first capacitor electrode may have a width of between 1 to 5 mm and the second capacitor may have a width of between 0.1 to 0.3 mm.

Optionally, the first capacitor electrode may have a width of approximately 1 mm and the second capacitor electrode may have a width of approximately 0.14 mm.

At least one edge or corner of the first capacitor electrode and/or the second capacitor electrode may be bevelled. The bevelling may help to reduce unnecessary radiation of the electric field generated by the electrodes, thereby improving capacitive sensitivity of the touch sensor.

The inner region of the touch sensor may comprise a hole for a backlight or light source. A backlight at least partially illuminates a touchpad which is beneficial for applications where the touchpad may be used in low visibility conditions or at night. In the prior art, if a backlight is required it is known to make a suitable hole in the first capacitive electrode for the backlight. This hole reduces capacitive sensitivity and negatively affects performance of the touch sensor. In contrast, in the present disclosure a hole for the backlight can be provided without any loss of capacitive sensitivity, as the hole is located in a designated inner region which is surrounded by the first capacitor electrode and the second capacitor electrode.

In some embodiments, the hole does not break, intersect or touch either of the first capacitor electrode and the second capacitor electrode.

Optionally, the inner region and/or the hole has a rectangle or square shape.

Optionally, the inner region or the hole may have an area of approximately 4 to 8 mm². In some embodiments, the hole may have an area of 6 mm². This size may be sufficient to allow enough light through to illuminate the touch sensor or touchpad.

In another aspect, the present disclosure provides a mutually capacitive touchpad comprising a mutually capacitive touch sensor according to any embodiment or example of the first aspect of the disclosure and a sensing circuit configured to monitor the capacitance of the second capacitor electrode.

Optionally, the touchpad comprises a power source connected, or configured to be connected, to the first capacitive sensor. Thus, the first capacitor electrode may be driven to produce an electric field and the second capacitor electrode may be monitored to detect any change in capacitance caused by a user touching the touch sensor.

Optionally, the touch sensor comprises a hole in the inner region as detailed above. The touchpad may further comprise a backlight or light source for at least partially illuminating the touchpad, wherein the backlight or light source is aligned with the hole provided in the inner region of the touch sensor.

The hole may not break or touch either of the first capacitor electrode and the second capacitor electrode.

Optionally, the touch sensor may be provided on a first PCB and the backlight or light source may be provided on a second PCB. In use, the first PCB may be positioned in front of the second PCB. The second PCB may be positioned such that the backlight or light source is aligned with the hole in the first PCB, such that light is emitted outwards through the hole.

The backlight or light source may be an LED.

The touchpad may comprise a plurality of mutually capacitive touch sensors arranged in a touch sensor array, wherein the sensing circuit is configured to monitor the capacitance at each of the second capacitor electrodes.

The second capacitor electrodes of each of the mutually capacitive touch sensors may be connected. Thus, each of the mutually capacitive touch sensors may share a single second capacitor electrode.

The touch sensor array may be arranged in a grid layout on a printed circuit board (e.g. the first printed circuit board).

The touchpad may form a touch keyboard or keypad.

In another aspect, the present disclosure provides a touch-sensitive device comprising the mutually capacitive touchpad of any embodiment or example of the second aspect of the disclosure.

The touch-sensitive device may be a lock, wherein the touchpad forms a keyboard or keypad to enable the user to input an identifier or authorisation code to enable or disable the lock.

BRIEF DESCRIPTION OF THE DRAWINGS

Illustrative embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings. It will be appreciated that the drawings are schematic illustrations and are not drawn to scale.

Figure 1:
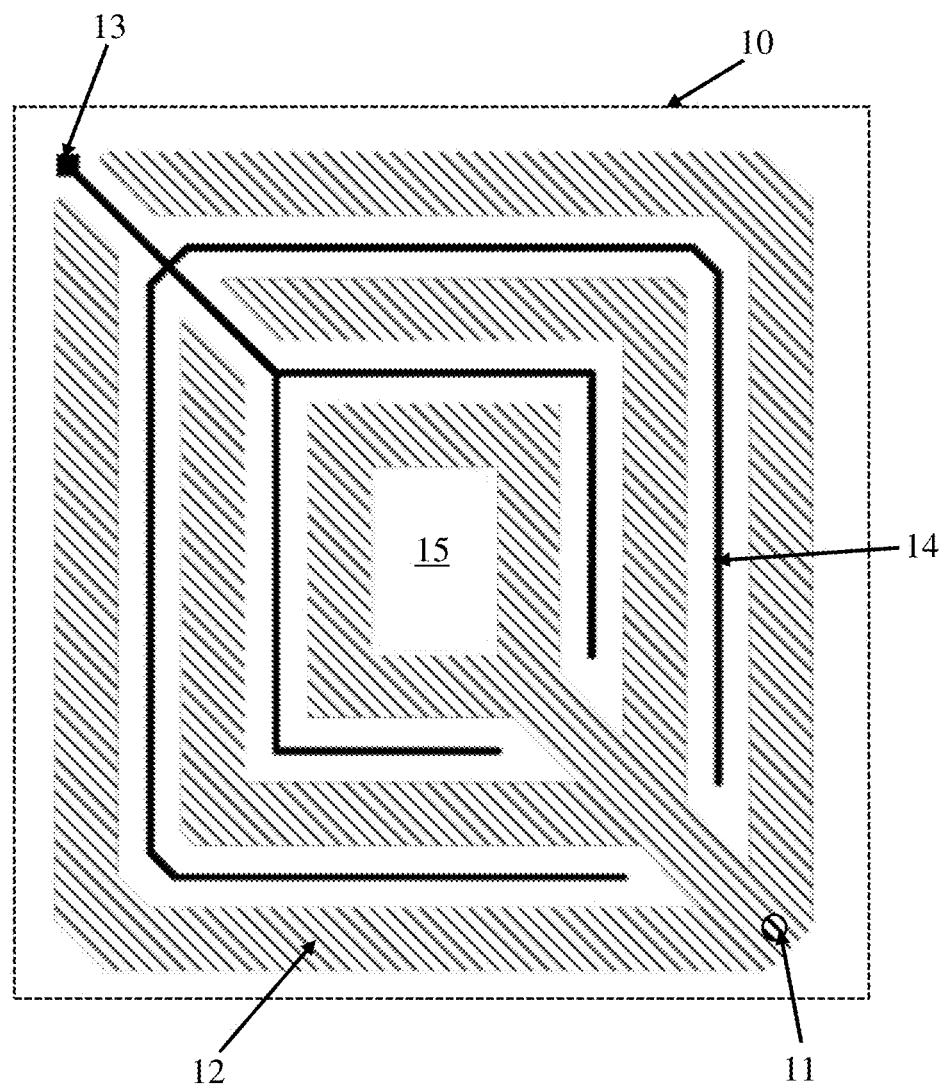
FIG. 1 is a schematic illustration of a mutually capacitive touch sensor according to an embodiment of this disclosure.

FIG. 1 shows a mutually capacitive touch sensor 10. The mutually capacitive touch sensor 10 may be provided on a PCB. The mutually capacitive touch sensor 10 comprises a first capacitor electrode 12 and a second capacitor electrode 14. The second capacitor electrode 14 is adjacent and spatially separated from the first capacitor electrode 12.

An inner or central region 15 is disposed between the first capacitor electrode 12 and the second capacitor electrode 14. The inner region 15 is a gap or space on the PCB. In the embodiment shown in FIG. 1, the inner region 15 has a rectangle shape, but it will be appreciated that the inner region 15 may have any shape.

The first capacitor electrode 12 and the second capacitor electrode 14 are arranged to surround the inner region 15 in a centrosymmetric pattern or design. In this embodiment, the first capacitor electrode 12 and the second capacitor electrode 14 are arranged in an interdigitated square pattern around the inner region 15.

The first capacitor electrode 12 and the second capacitor electrode 14 each comprise multiple fingers that branch off a connecting path. The fingers extend around the inner region 15 to form a ring or incomplete ring around the inner region 15. In the embodiment shown in FIG. 1, the first capacitor electrode 12 comprises three fingers, and the second capacitor electrode comprises two fingers. Each finger or ring of the second capacitor electrode 14 is disposed between adjacent fingers or rings of the first capacitor electrode 12. Thus, the fingers or rings of the first capacitor electrode 12 and the second capacitor electrode 14 form an alternating pattern centered on the inner region 15.

This conductor arrangement may be particularly advantageous if the touch sensor 10 is used as a touch button. In comparison, in prior art designs the first capacitor electrode 12 and the second capacitor electrode 14 are arranged in a jagged, toothed or serriform pattern, wherein the electrodes do not surround an inner region (e.g. a gap or space).

In other embodiments (not shown) the inner region 15 may not be located at the center of the touch sensor 10. It will also be appreciated that the first capacitor electrode 12 and the second capacitor electrode 14 may be arranged in a variety of different patterns around the inner region.

The corners of each of the first capacitor electrode 12 and the second capacitor electrode 14 are beveled.

The first capacitor electrode 12 has a large surface area relative to the second capacitor electrode 14. This is because the first capacitor electrode 12 is a transmit or drive electrode (also known as an X pad) and the second capacitor electrode 14 is receive or sense electrode ((also known as a Y pad). Increasing the surface area of the first capacitor electrode 12 increases the capacitive sensitivity of the touch sensor 10. Decreasing the surface area of the second capacitor electrode 14 reduces the risk of interference.

In some embodiments, the first capacitor electrode 12 may have a width of around 1 mm and the second capacitor electrode 14 may have a width of around 0.14 mm. The inner region 15 may have an area of around 6 mm$^2$.

The first capacitor electrode 12 comprises a first terminal 11. The second capacitor electrode 14 comprises a second terminal 13. The first terminal 11 and the second terminal 13 are disposed at opposing corners of the touch sensor 10. The connecting path that connects the fingers or rings of the first capacitor electrode 12 may extend in a straight line from the first terminal 11 towards the inner region 15. Similarly, the connecting path that connects the fingers or rings of the second capacitor electrode 14 may extend in a straight line from the second terminal 13 towards the inner region 15.

In use, the first terminal 11 is connected to a power source which causes the first capacitor electrode 12 to emit an electric field. This electric field is received by the second capacitor electrode 14. In use, the second terminal 13 is connected to a sensing circuit configured to monitor the capacitance of the second capacitor electrode 14. If a user touches the touch sensor 10 this results in a change in capacitance of the second capacitor electrode 14.

Figure 2:
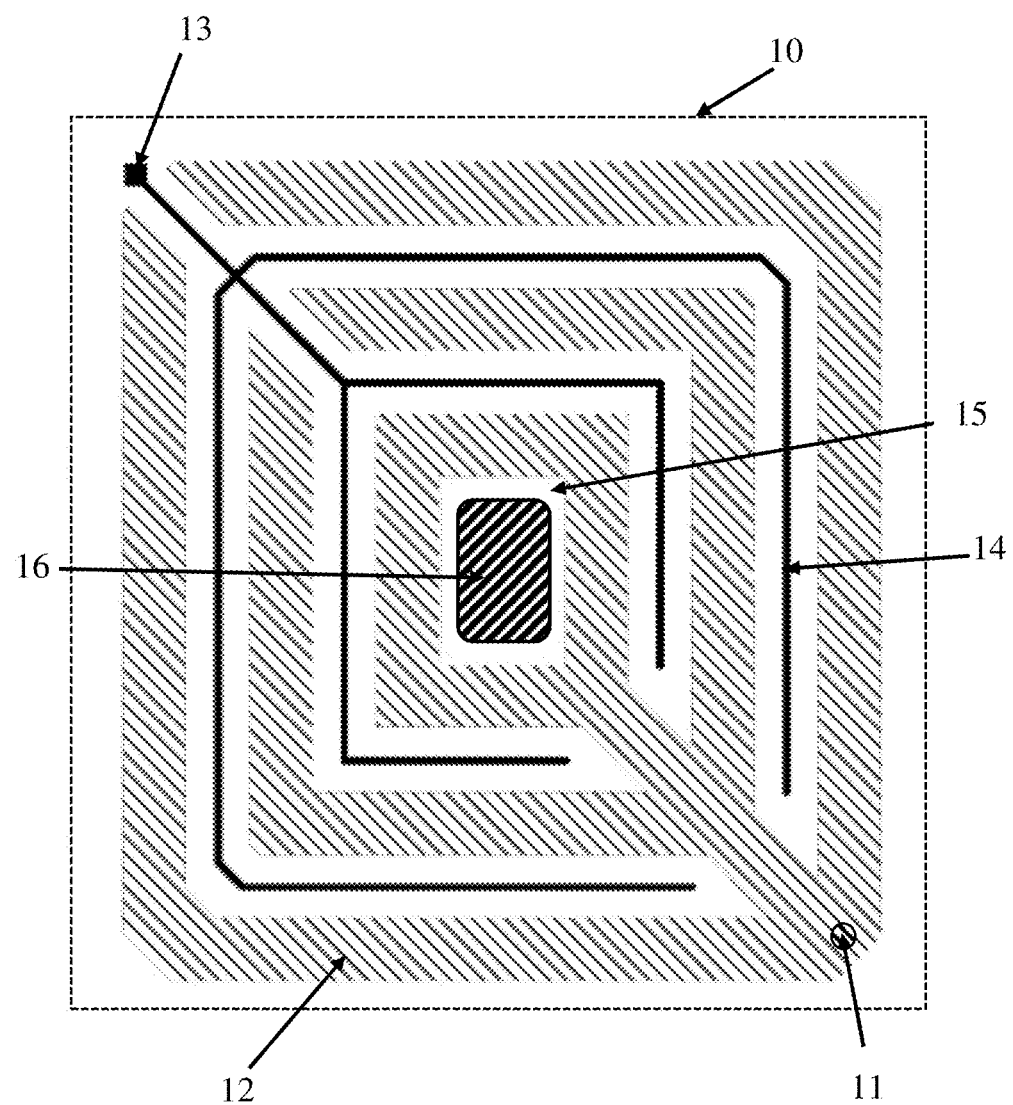
FIG. 2 is a schematic illustration of a mutually capacitive touch sensor according to another embodiment of this disclosure.

FIG. 2 shows a similar mutually capacitive touch sensor 10 to the touch sensor 10 illustrated in FIG. 1. In this embodiment, the inner region 15 comprises a hole 16 for a backlight. The hole 16 does not break or intersect either the first capacitor electrode 12 or the second capacitor electrode 14. The hole 16 is contained within the inner region 15.

Accordingly, the backlight hole may be provided without reducing the capacitive sensitivity of the touch sensor.

The hole 16 allows light from a light source positioned behind the touch sensor 10 (i.e. backlight) to illuminate the touch sensor or touchpad. This is shown in FIG. 3.

Figure 3:
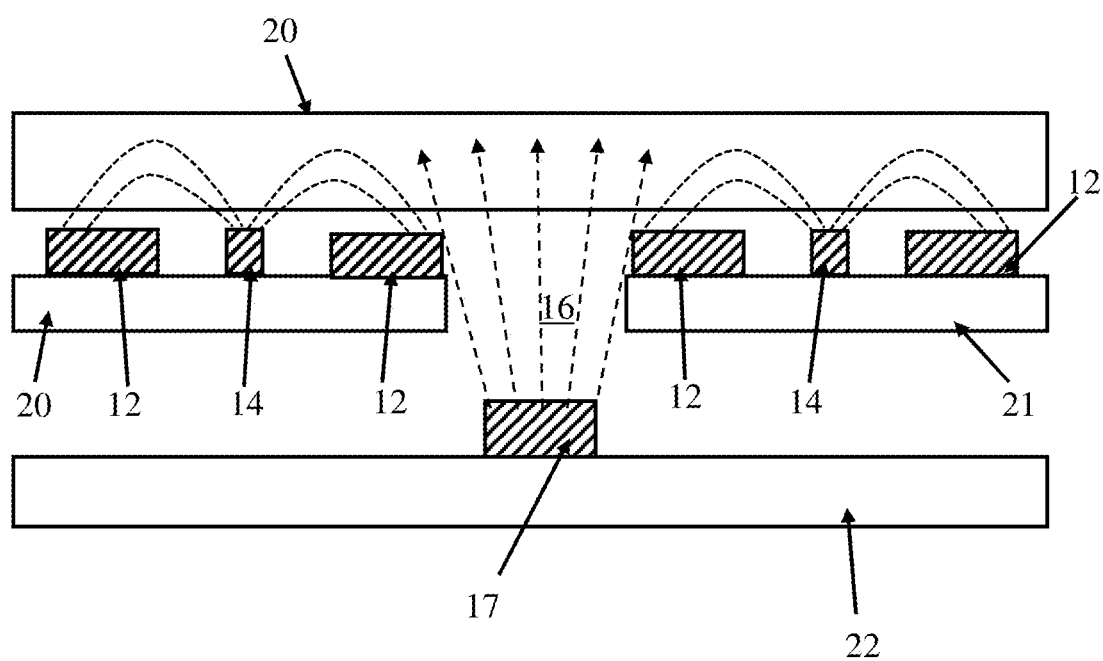
FIG. 3 is a schematic illustration of a cross-section through a touchpad according to an embodiment of this disclosure.

As shown in FIG. 3, the touch sensor is provided on a first PCB 21. The touch sensor may be as depicted in FIG. 2. The first capacitor electrode 12 emits an electric field, illustrated by the broken lines, that is received by the second capacitor electrode 14. A covering panel board 20 is provided on top of the touch sensor and first PCB 21.

A light source 17, such as an LED, is provided on a second PCB 22. The second PCB 22 is mounted behind the first PCB 21, such that the light source 17 is aligned with the hole 16 in the first PCB 21. Thus, the light source 17 emits light through the hole 16, forming a backlight. The backlight 17 provides a clear visual indication to the user of the location of the touch sensor (i.e. where the user should press to operate the touchpad).

Figure 4:
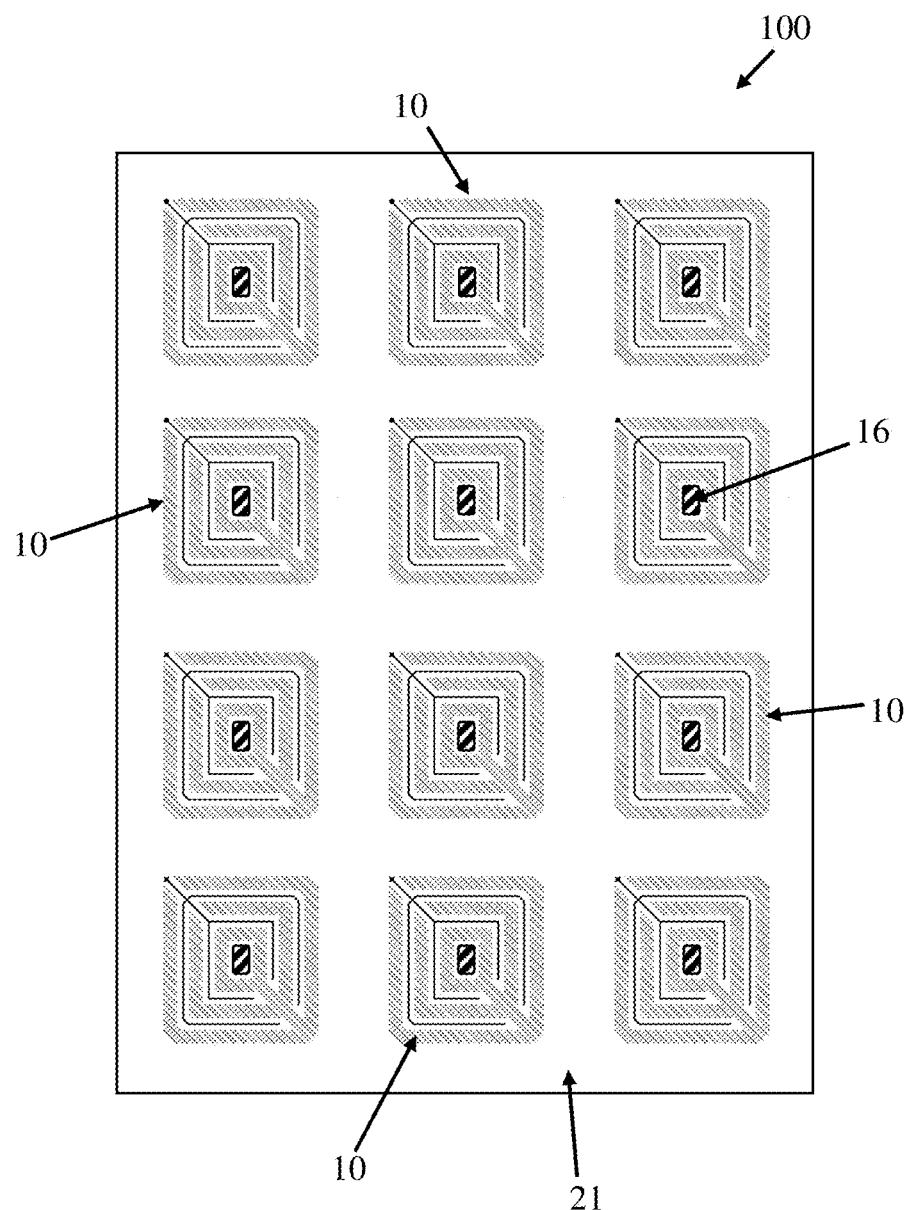
FIG. 4 is a schematic illustration of a front view of a touchpad according to an embodiment of this disclosure.

FIG. 4 shows an illustration of a front view of a touchpad 100 according to an embodiment of the disclosure. The touchpad 100 comprises a plurality of touch sensors 10 arranged in a touch sensor array. The location of each touch sensor 10 may correspond to a touch button on the touchpad 100.

In this embodiment, twelve touch sensors 10 are arranged in a 3×4 grid (three vertical columns with four touch sensors in each column). However, it will be appreciated that any number of touch sensors 10 may be provided in a variety of array layouts.

Each touch sensor 10 in the array comprises a hole 16 for a backlight, as shown in FIGS. 2 and 3. However, in other embodiments, some or all of the touch sensors 10 may be provided without holes 16, as in FIG. 1.

The touchpad 100 may form part of a touch-sensitive device. For example, the touchpad 100 may be used as a touch keypad in a lock device. It will be appreciated that the touchpad 100 has many possible uses and is not limited to use in any particular type of touch-sensitive device.

Accordingly, there has been described a mutually capacitive touch sensor comprising a first capacitor electrode and a second capacitor electrode. The second capacitor electrode is adjacent and spatially separated from the first capacitor electrode. An inner region is disposed between the first capacitor electrode and the second capacitor electrode, wherein the first capacitor electrode and the second capacitor electrode are arranged to surround the inner region. The inner region may comprise a hole for a backlight.

Although particular embodiments of this disclosure have been described, it will be appreciated that many modifications/additions and/or substitutions may be made within the scope of the claims.

The invention claimed is:

1. A mutually capacitive touch sensor comprising:
   a first capacitor electrode;
   a second capacitor electrode, wherein the second capacitor electrode is adjacent and spatially separated from the first capacitor electrode; and
   an inner region including a hole for a backlight, wherein the first capacitor electrode and the second capacitor electrode each comprise a plurality of fingers extending around the hole,
   wherein:
      the fingers of the first capacitor electrode are interdigitated with the fingers of the second capacitor electrode, and
      a first finger of the first capacitor electrode extends around the hole, and a first finger of the second capacitor electrode extends around the first finger of the first capacitor electrode and the hole such that the first finger of first capacitor electrode is between the hole and the finger of the second capacitor electrode.

2. The mutually capacitive touch sensor of claim 1, wherein the first capacitor electrode and the second capacitor electrode each form a centrosymmetric pattern around the inner region.

3. The mutually capacitive touch sensor of claim 1, wherein the first capacitor electrode and the second capacitor electrode are arranged in a concentric pattern around the inner region.

4. The mutually capacitive touch sensor of claim 1, wherein each finger of each of the first and second capacitor electrodes is implemented as a connected ring or incomplete ring surrounding the hole.

5. The mutually capacitive touch sensor of claim 1, wherein the first capacitor electrode comprises a first terminal and the second capacitor electrode comprises a second terminal, wherein the first and second terminals are disposed at opposing edges or corners of the touch sensor.

6. The mutually capacitive touch sensor of claim 1, wherein the first capacitor electrode does not overlap the second capacitor electrode.

7. The mutually capacitive touch sensor of claim 1, wherein the first capacitor electrode has a larger surface area than the second capacitor electrode.

8. The mutually capacitive touch sensor of claim 7, wherein the first capacitor electrode has a width of between 1 to 5 mm and the second capacitor has a width of between 0.1 to 0.3 mm.

9. The mutually capacitive touch sensor of claim 1, wherein the first capacitor electrode and the second capacitor electrode are coplanar.

10. The mutually capacitive touch sensor of claim 9, wherein the hole does not break or touch either of the first capacitor electrode and the second capacitor electrode.

11. A mutually capacitive touchpad comprising:
   a mutually capacitive touch sensor comprising:
      a first capacitor electrode;
      a second capacitor electrode, wherein the second capacitor electrode is adjacent and spatially separated from the first capacitor electrode; and
      a hole for a backlight, wherein the hole does not contact either of the first capacitor electrode and the second capacitor electrode, wherein each of the first capacitor electrode and the second capacitor electrode surround the hole, and the first capacitor electrode and the second capacitor electrode are interdigitated such that a finger of the first capacitor electrode is between the hole and a finger of the second capacitor electrode; and a sensing circuit configured to monitor the capacitance of the second capacitor electrode.

12. The mutually capacitive touchpad of claim 11, wherein the first capacitor electrode and the second capacitor electrode each form a centrosymmetric pattern around the hole.

13. The mutually capacitive touchpad of claim 11, wherein the first capacitor electrode and the second capacitor electrode are coplanar.

14. The mutually capacitive touchpad of claim 13, wherein the finger of the first capacitor electrode and the finger of the second capacitor electrode are each implemented as a connected ring or an incomplete ring.

15. The mutually capacitive touchpad of claim 11, further comprising a plurality of mutually capacitive touch sensors arranged in a touch sensor array, wherein the sensing circuit is configured to monitor the capacitance at each of the second capacitor electrodes.

16. The mutually capacitive touchpad of claim 11, wherein:

the first capacitor electrode and the second capacitor electrode are arranged in a concentric pattern around the hole.

17. The mutually capacitive touchpad of claim 11, wherein:

the first capacitor electrode and the second capacitor electrode are interdigitated.

18. The mutually capacitive touchpad of claim 11, wherein:

the first capacitor electrode and the second capacitor electrode each comprise a plurality of connected rings or incomplete rings surrounding the inner region and wherein each ring or incomplete ring of the second capacitor electrode is disposed between adjacent rings or incomplete rings of the first capacitor electrode.

19. The mutually capacitive touchpad of claim 11, further comprising:

a backlight for at least partially illuminating the touchpad, wherein the backlight is aligned with the hole of the touch sensor.

20. The mutually capacitive touchpad of claim 19, wherein the touch sensor is provided on a first PCB and the backlight is provided on a second PCB, wherein the second PCB is positioned such that light is emitted outwards through the hole.

* * * * *